(12) United States Patent
Ko et al.

(10) Patent No.: US 8,481,412 B2
(45) Date of Patent: Jul. 9, 2013

(54) METHOD OF AND APPARATUS FOR ACTIVE ENERGY ASSIST BAKING

(75) Inventors: Chung-Chi Ko, Nantou (TW); Chia Cheng Chou, Keelung (TW); Keng-Chu Lin, Ping-Tung (TW); Joung-Wei Liou, Zhudong Town (TW); Shwang-Ming Jeng, Hsinchu (TW); Mei-Ling Chen, Hsinchu County (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 51 days.

(21) Appl. No.: 12/893,399

(22) Filed: Sep. 29, 2010

(65) Prior Publication Data
US 2012/0077339 A1    Mar. 29, 2012

(51) Int. Cl.
    *H01L 21/425* (2006.01)
(52) U.S. Cl.
    USPC ........... 438/514; 438/199; 438/229; 438/595; 438/914; 257/E21.041
(58) Field of Classification Search
    USPC ................. 438/618, 633, 638, 652, 672, 675; 257/E21.041
    See application file for complete search history.

(56) References Cited

U.S. PATENT DOCUMENTS

| 5,930,890 | A  | * | 8/1999  | Chou et al. ...................... 29/852 |
| 6,605,413 | B1 | * | 8/2003  | Lyons et al. .................. 430/314 |
| 8,187,897 | B2 | * | 5/2012  | Cohn et al. ........................ 438/8 |
| 2008/0026579 | A1 | * | 1/2008  | Lai et al. ........................ 438/687 |
| 2009/0075491 | A1 | * | 3/2009  | Liu et al. ........................ 438/800 |
| 2009/0291389 | A1 | * | 11/2009 | Allen et al. ................ 430/270.1 |
| 2010/0068897 | A1 |   | 3/2010  | Liu et al. |

OTHER PUBLICATIONS

Ghandhi, Sorab K., "VLSI Fabrication Principles", 1983 by John Wiley & Sons, Inc., pp. 517-520.*

* cited by examiner

*Primary Examiner* — Michelle Mandala
(74) *Attorney, Agent, or Firm* — Lowe Hauptman Ham & Berner, LLP (57) ABSTRACT

A method of and apparatus for forming interconnects on a substrate includes etching patterns in ultra-low k dielectric and removing moisture from the ultra-low k dielectric using active energy assist baking. During active energy assist baking, the ultra-low k dielectric is heated and exposed to light having only wavelengths greater than 400 nm for about 1 to about 20 minutes at a temperature of about 300 to about 400 degrees Celsius. The active energy assist baking is performed after wet-cleaning or after chemical mechanical polishing, or both.

20 Claims, 6 Drawing Sheets

METHOD OF AND APPARATUS FOR ACTIVE ENERGY ASSIST BAKING

TECHNICAL FIELD

The present disclosure relates generally to a semiconductor manufacturing process, and more particularly, to a semiconductor process and tool for forming interconnects.

BACKGROUND

In order to reduce interconnect delay and capacitance, low dielectric constant (low-k) materials are used as the insulating dielectric for metal wires in integrated circuit (IC) devices. In recent years, low-k (k less than about 3.5) materials have been developed to replace relatively high dielectric constant insulating materials, such as silicon dioxide. In particular, low-k films are being utilized for inter-level and intra-level dielectric layers between metal wires in semiconductor devices. Additionally, some ultra-low k (less than k of about 2.5) material films are formed with pores, i.e., porous low-k dielectric films. Such ultra-low k films can be deposited by a spin-on dielectric (SOD) method similar to the application of photo-resist, or by chemical vapor deposition (CVD). Thus, the use of low-k and ultra-low k materials is readily adaptable to existing semiconductor manufacturing processes.

Low-k and ultra-low k materials are less robust than more traditional silicon dioxide and thus are easily damaged during plasma processing. They also readily absorb moisture in the environment and during wet processing. The inclusion of moisture, plasma damage, and by-products from their forming can adversely affect the electrical performance and reliability of the product.

While existing methods of forming an interconnect have been generally adequate, they have not been entirely satisfactory in every aspect. More efficient methods and chambers that remove unwanted moisture and by-products, and repair damage without increasing the dielectric constant continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

One aspect of the present invention involves a method of forming interconnects on a substrate. The method includes depositing an ultra-low k dielectric layer on the substrate, etching a first pattern in the ultra-low k dielectric layer, active energy assist (AEA) baking the substrate, filling the pattern with a metal and, planarizing the metal to expose a portion of the ultra-low k dielectric layer. The AEA baking may be performed (1) after etching and before filling the pattern and/or (2) after planarizing. During active energy assist baking, the ultra-low k dielectric is heated and exposed to light having only wavelengths greater than 400 nm for about 1 to about 20 minutes at a temperature of about 300 to about 400 degrees Celsius.

Another aspect of the present invention involves a method of forming interconnects on a substrate after a -SPSE (-special pattern/special etch) process. The method includes depositing an ultra-low k dielectric layer on the substrate, performing a first photo-lithography process to form a first pattern, etching the first pattern in the ultra-low k dielectric layer, performing a second photo-lithography process to form a second pattern, etching the second pattern in the ultra-low k dielectric layer, wet-cleaning the substrate, active energy assist (AEA) baking the substrate after the wet-cleaning, filling the pattern with a metal, and chemical mechanical polishing the metal to expose a portion of the ultra-low k dielectric layer. The active energy assist baking may be performed also after chemical mechanical polishing. In the SPSE process, the first pattern and the second pattern, if super-imposed, form an image that cannot be resolved using one photomask.

Yet another aspect of the present invention involves an active energy assist (AEA) baking chamber that includes an AEA light source assembly, a heater pedestal, and a controller to control the power input to the AEA light source assembly and the heater pedestal. These and other features of the present disclosure are discussed below with reference to the associated drawings.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. This repetition is for the purpose of simplicity and clarity and does not in itself dictate a relationship between the various embodiments and/or configurations discussed.

As critical dimensions continue to shrink, dielectric materials having lower dielectric constants are increasingly used as the insulating dielectric in interconnect structures. A known interconnect structure includes multiple metal layers of metal filled vias and trenches with dielectric material between the vias and trenches. A typical metal layer according to damascene processing is formed generally as follows. A dielectric layer is deposited on a substrate, which includes partially fabricated devices and/or circuitry. A pattern is then formed on the dielectric layer to define the metal features, which may includes both trenches and vias. The pattern is then used to etch the dielectric layer and in some places expose any metal contacts in the layer below. The typical etch process is an anisotropic dry etch followed by a wet clean. The pattern thus etched is then filled with a metal, typically copper, in several operations. A thin film of barrier/seed material is deposited in the etched pattern to prevent subsequent copper diffusion and to provide a seed layer for copper electroplating. Then copper is electroplated in the pattern to fill it. The copper not only fills the patterns, but also accumulates in the field area above the unpatterned portions of the dielectric layer. The substrate is then planarized using chemical mechanical polishing (CMP) to remove the copper from the field area to expose the dielectric layer.

This typical process includes many opportunities for moisture to enter the layer. Moisture in the ambient environment can enter the dielectric layer whenever the dielectric layer is exposed to the ambient environment, most typically after the substrate exits a semiconductor tool and is being queued before the next operation. Moisture is also present in wet processing: during wet clean and CMP. Moisture in the wet etchant and CMP slurry can enter the dielectric material.

The amount of moisture uptake depends in part on the condition of the dielectric material. The highly porous ultra-low k material absorbs more moisture than less porous material. Further, more moisture tends to be absorbed through a plasma-damaged surface, such as the surface that results from etching. The moisture absorption can be roughly divided into two categories: dangling bond and van der Waals. After plasma etching, some silicon dangling bonds remain and readily bonds with moisture in the environment, in wet etchants, or in slurries. Moisture is also attracted to the dielectric material through the weaker van der Waals force. Moisture absorbed through dangling bonds is harder to remove than those absorbed through van der Waals.

Although the substrate is dried after each of the wet processes, the drying operation only removes moisture not absorbed and bound. Further drying by thermal baking the substrate in a furnace or single wafer baking (SWB) chamber is used to remove some of the bound moisture. Typically, substrates are baked for about one or more minutes at a temperature of about 350° C. However, with the use of highly porous materials, an increasingly longer bake time is required to adequately remove the moisture and by-products of other processes. At bake times of 30 minutes or longer, the baking operation adversely affects production and impacts cycle time. In some cases where more of the moisture is absorbed through the dangling bond mechanism, even higher substrate temperature may be required to remove the moisture—and the use of high temperatures is constrained by the total thermal budget allowed for processing the substrate.

Active energy assist (AEA) baking is used to remove moisture in addition to or instead of thermal baking in accordance various embodiments of the present invention. AEA baking involves exposing the substrate to light radiation having only wavelengths greater than about 400 nm or only wavelengths between about 400 nm and about 1000 nm. The substrate may be concurrently heated thermally through a heater pedestal. The substrate is AEA baked for at least one minute, for about 5 to about 20 minutes, or for about 10 minutes. During AEA baking, the substrate temperature is raised to and maintained at about 350 degrees Celsius, or about 300 to about 400 degrees Celsius. The light intensity is from about 10 W/cm$^2$ to about 500 W/cm$^2$, or at least 10 W/cm$^2$.

At wavelengths less than about 400 nm, the light energy is sufficient to promote cross-linking of silicon-oxygen bonds in the dielectric film. While higher cross-linking improves mechanical properties of the dielectric film, it also causes film shrinkage and increase dielectric constants of the dielectric film. The film shrinkage changes critical dimensions by making vias and trenches larger. An increase in the dielectric constant is undesirable because it contradicts the purpose of using low-k and ultra-low k material as the dielectric layer. Thus, AEA baking does not include exposing the substrate to light energy sufficient to promote cross-linking, at wavelengths less than about 400 nm, or less than about 350 nm.

The wavelength range between about 400 nm and 1000 nm cover the visible light spectrum and a portion of near infrared. At these wavelengths, the light energy is sufficient to break silanol (Si—OH) bonds and overcome the van der Waals attraction between the absorbed moisture and the dielectric material, but not sufficient to cause harmful cross-linking. Moisture and by-products from various stages of the interconnect forming process are removed during AEA baking. An example of a by-product may be additional constituent deposited with the dielectric layer that is intended to be evolved and removed during subsequent processing.

At wavelengths longer than 1000 nm and shorter than about 1 mm, the radiation is mostly heat radiation and is insufficient to break the bonds at the baking temperature. Thus AEA baking does not exclude exposing the substrate to radiation at wavelengths longer than about 1000 nm, but radiation at that wavelength range is not used for moisture removal, but mainly raises substrate temperature to the baking temperature.

According to certain embodiments, forming the interconnect using AEA baking improves process time as compared to thermal only baking. The process time improvement reduces costs and increases tool utilization and cycle time. The use of AEA baking also conserves back-end thermal budget.

AEA baking is particularly useful with the implementation of porous ultra-low k dielectric film and SPSE (special pattern/special etch) processing, as defined above. In SPSE processing, the dielectric layer is patterned and etched twice to form a pattern that cannot be resolved using one photomask. A first bottom anti reflection coating (BARC) and a first photoresist layer is deposited over the dielectric layer, exposed, developed, and etched to form a first pattern in the dielectric layer, and removed before a second BARC and a second photoresist is deposited for forming a second pattern in the dielectric layer. FIGS. 1 and 2A-2D illustrate the SPSE processing and AEA baking in the context of interconnect formation. The SPSE processing is believed to cause more moisture absorption and plasma damage than other patterning processes.

Figure 1:
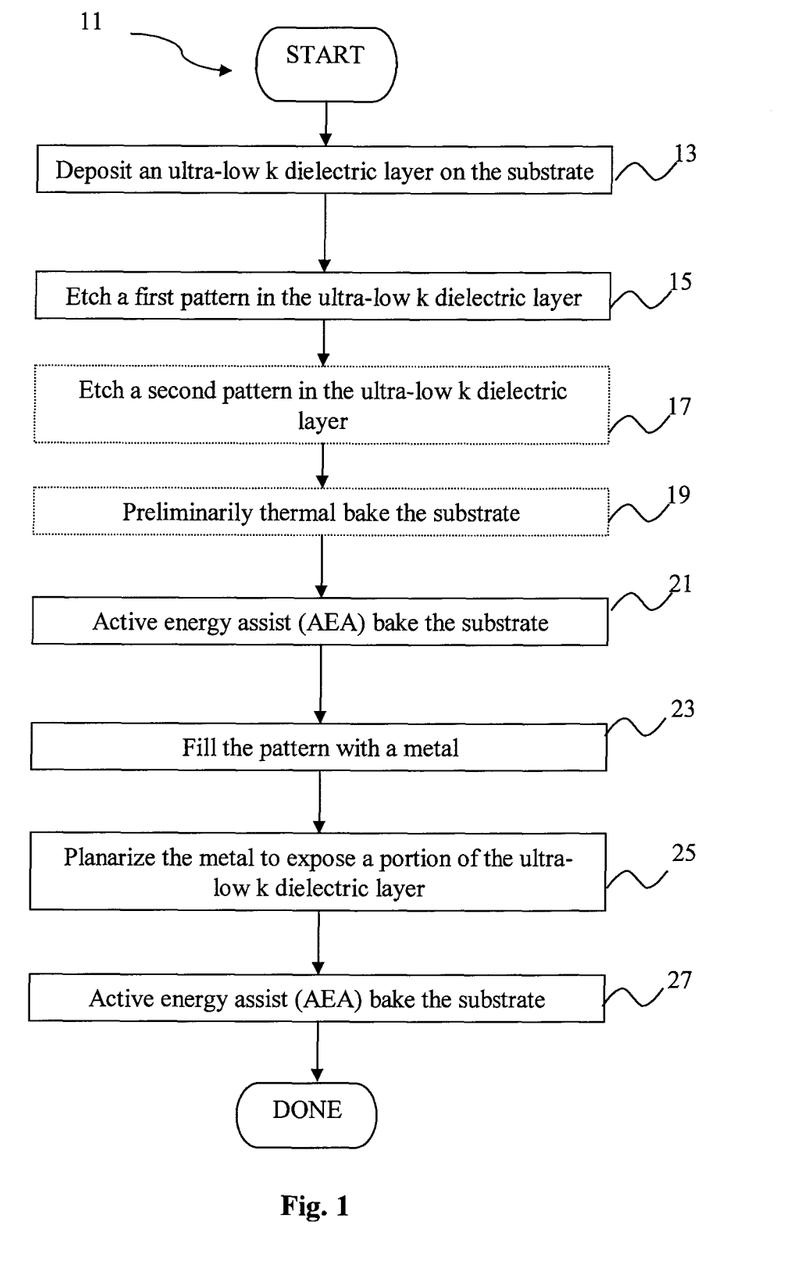
FIG. 1 is a flowchart illustrating a method of forming interconnects according to various embodiments of the present invention.

FIG. 1 illustrates a method 11 of forming interconnects using ultra-low k dielectric film and SPSE processing in accordance with various embodiments of the present disclosure. In operation 13, an ultra-low k dielectric layer is deposited on the substrate. The top surface of the substrate may be a semiconductor, a metallic conductor, or any other material to which the dielectric film is to be formed upon. Most commonly, the substrate includes partially fabricated semiconductor devices having layers of previously deposited material. The dielectric film can have a dielectric constant value less than the dielectric constant of $SiO_2$, which is approximately 4 (e.g., the dielectric constant for thermal silicon dioxide can range from 3.8 to 3.9). The dielectric film may have a dielectric constant of less than 2.5, a dielectric constant of less than 2.2, or a dielectric constant of less than 1.7. The dielectric film may be described as an ultra-low k film. The dielectric film may include at least one of an organic, inorganic, and inorganic-organic hybrid material. Additionally, the dielectric film may be porous or non-porous.

The dielectric film may include a single phase or dual phase porous film that includes a structure-forming material and a pore-generating material. The structure-forming material may include an atom, a molecule, or fragment of a molecule that is derived from a structure-forming precursor. The pore-generating material may include an atom, a molecule, or fragment of a molecule that is derived from a pore-generating precursor (e.g., porogen). The single phase or dual phase porous film may have a higher dielectric constant prior to removal of the pore-generating material than following the removal of the pore-generating material. For example, forming a single phase porous dielectric film includes depositing a structure-forming molecule having a pore-generating molecular side group weakly bonded to the structure-forming molecule on a surface of a substrate. Additionally, for example, forming a dual phase porous dielectric film includes co-polymerizing a structure-forming molecule and a pore-generating molecule on a surface of a substrate.

Examples of dielectric films include Black Diamond™ CVD organosilicate glass (OSG) films commercially available from Applied Materials, Inc., or Coral™ CVD films commercially available from Novellus Systems. Other dielectric films include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Other examples include various SiLK semiconductor dielectric resins commercially available from Dow Chemical, and FLARE™ and Nanoglass™ commercially available from Honeywell.

The dielectric film can be formed using chemical vapor deposition (CVD) techniques, or spin-on dielectric (SOD) techniques such as those available from Tokyo Electron Limited (TEL), Applied Materials, Inc., or Novellus Systems.

Figure 2A:
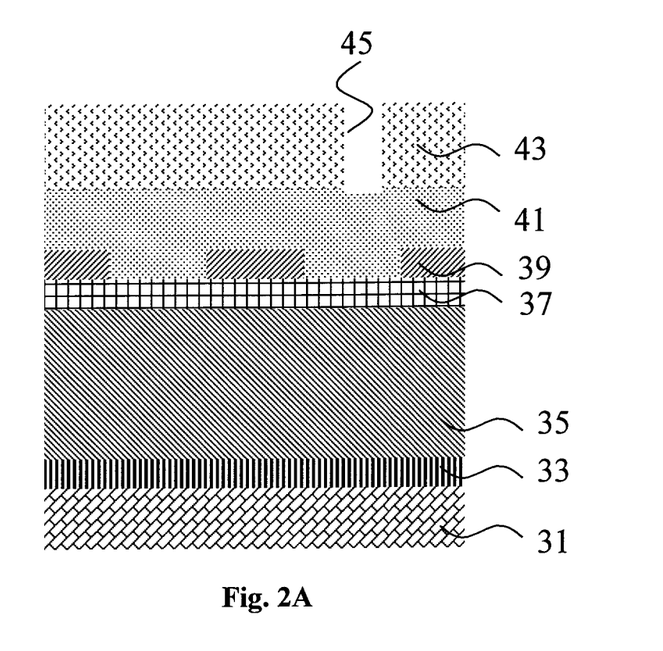
FIGS. 2A-2D illustrate cross-sectional views of one layer of interconnects at various stages of fabrication according to various embodiments of the method of FIG. 1.
Figure 2B:
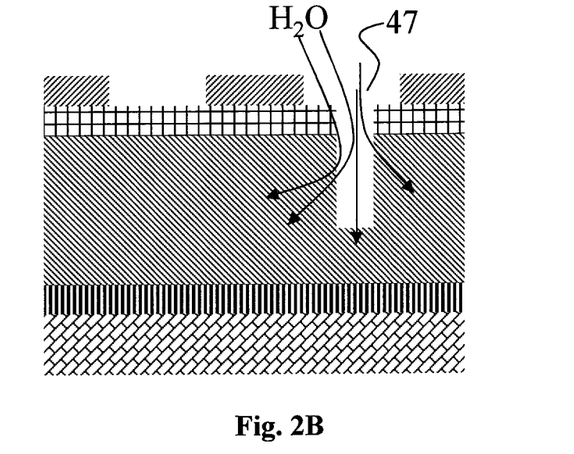

A first pattern is formed and etched in the ultra-low k dielectric layer in operation 15. FIG. 2A illustrates forming the first pattern. A substrate 31 is below an etch stop layer 33, which is below an ultra-low k dielectric layer 35. A anti reflective layer 37 (ARL) and a patterned hard mask layer 39 are formed over the ultra-low k dielectric layer 35. A first bottom anti reflection coating (BARC) 41 and a first photoresist layer 43 are deposited over the hard mask layer 39 and hence the dielectric layer 35. A portion 45 of photoresist 43 is exposed to radiation through a photomask which alters the chemical property of the photoresist in the exposed portion, rendering it susceptible to be dissolved by a developer chemical. In FIG. 2A, the portion 45 of photoresist layer 43 is exposed to the radiation, developed, and removed. The remaining portion of the photoresist layer is hardened. A first pattern is thus formed in the photoresist. The pattern 45 is then extended into the ultra-low k dielectric layer 35 by etching. As shown in FIG. 2B, the etching extends the opening 45 into the ultra-low k dielectric layer 35, forming a via 47. The etching condition is selected such that the material under the opening portion 45 of the photoresist layer 43 is preferentially etched over the hardened remaining portion of the photoresist layer 43. After the via 47 is formed, the BARC 41 and the remaining portion of the photoresist layer 43 are removed in a stripping process, resulting in the structure shown in FIG. 2B.

Figure 2C:
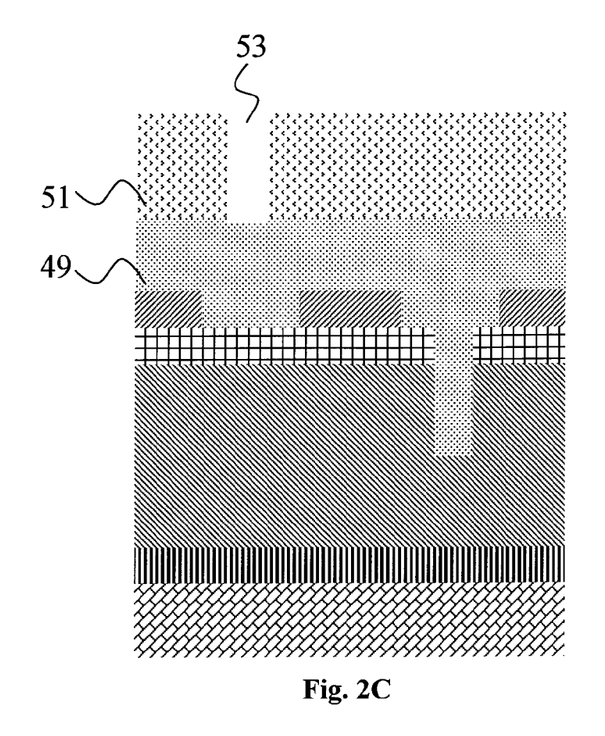

In the next operation of FIG. 1, a second pattern is formed and etched in the ultra-low k dielectric layer in operation 17. FIG. 2C illustrates forming the second pattern. A second BARC 49 and a second photoresist layer 51 is deposited over the hard mask layer 39 and hence the dielectric layer 35, filling the previously formed via 47. A portion of photoresist is exposed to radiation through a photomask which alters the chemical property of the photoresist, rendering it susceptible to be dissolved by a developer chemical. In FIG. 2C, the portion 53 of photoresist layer 51 is exposed to the radiation and removed after developing. A second pattern is thus formed in the photoresist. The pattern 53 is then extended into the ultra-low k dielectric layer 35 by etching.

Figure 2D:
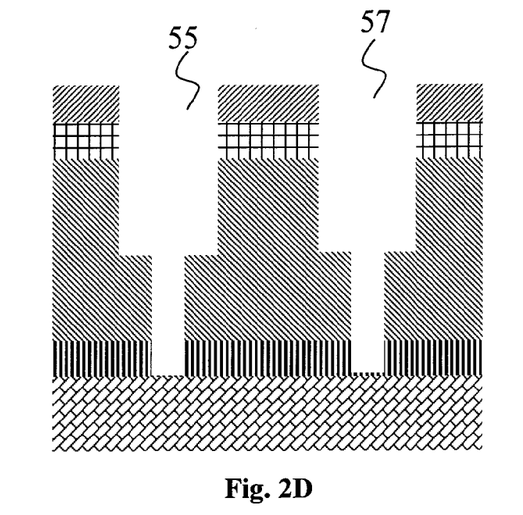

The photoresist layer 51 and optionally the BARC 49 are then removed. As shown in FIG. 2D, further etching extends the openings 53 and 45 into the ultra-low k dielectric layer 35, now using the opening in the hardmask 39 as the pattern to form trench/via features 55 and 57, which extends through the etch stop layer 33. Any remaining BARC and photoresist are removed in a stripping process. After stripping, the substrate may be wet cleaned.

As discussed, the SPSE process is used when one photolithography process cannot create the desired pattern in the dielectric layer. The SPSE process creates features that are closer together and more numerous than can be achieved by an image that is created using one photomask. Thus, the distance between the patterned features in a SPSE process may be smaller than that of a minimum spacing between features in one photomask. Because the features are more numerous or are closer together, more of the ultra-low k dielectric surface is exposed after the etching process. When damaged by the etching process, the larger surface area readily absorbs moisture in the ambient environment and in wet processes. Conventional thermal only baking cannot remove this moisture sufficiently and an active energy assist (AEA) baking is used instead of or in addition to conventional thermal baking.

Referring back to FIG. 1, the substrate is optionally subjected to a preliminary thermal bake in operation 19. The preliminary thermal bake is similar to conventional thermal baking where the substrate is heated to about 300 to about 400 degrees Celsius, or about 350 degrees Celsius for a few seconds to a few hours, or about one minute. The preliminary thermal bake removes surface unbound moisture and some of the weakly bound moisture, i.e., those bound through van der Waals force.

The substrate is then active energy assist (AEA) baked in operation 21 to remove more of the bound moisture. The AEA baking includes exposing the substrate to certain light radiation while maintaining the substrate temperature. In certain embodiments, AEA baking involves exposing the substrate to light radiation having only wavelengths greater than 400 nm or only wavelengths between about 400 nm and 1000 nm. The substrate temperature may be controlled through a heater pedestal. The substrate is AEA baked for at least one minute, for about 1 to about 20 minutes, or for about 10 minutes. During AEA baking, the substrate temperature is raised to and maintained at about 350 degrees Celsius, or about 300 to about 400 degrees Celsius.

The AEA baking and the preliminary thermal baking may occur in the same chamber or different chambers. For example, the substrate may be heated through a pedestal heater under preliminary thermal baking conditions before it is exposed to the AEA light radiation on the same pedestal heater. In other embodiments, the substrate may be thermally baked immediately after wet etching and stored in a stocker until AEA baking. AEA baking is found to reduce a subsequent moisture absorbency of the dielectric material. In other words, AEA baking has a damage repair effect where some of the moisture absorbing sites are disabled after AEA baking such that less moisture is absorbed after AEA baking. According to this feature, an AEA bake may be performed soon after a wet process to decrease the moisture absorbency of the dielectric layer. Of course, an AEA bake may be performed just before filling the trenches and vias with a metal. In some cases, the AEA bake may be performed before a barrier seed layer without breaking vacuum.

The substrate pattern is then filled with a metal in operation 23. The metal is usually copper. Copper filling includes a barrier seed layer and a bulk filling. The barrier seed layer may include several thin layers including a liner layer, a barrier layer, and a seed layer. Each of the barrier seed layer may be deposited using known techniques such as physical vapor deposition (PVD), chemical vapor deposition (CVD), or less commonly electro or electroless deposition techniques. The barrier seed layer for copper filling usually includes materials other than copper. Example materials include titanium, tantalum, ruthenium, cobalt, palladium, nickel, copper, and compounds and alloys having these metals, such as tantalum nitride. The pattern is then filled with a metal, which may be copper or other commonly used conductors. Bulk copper filling is usually achieved with electrochemical plating known in the art.

To ensure complete filling, the bulk filling process may overshoot for some portion of the pattern. In that case the substrate is planarized in operation 25. The planarization may involve chemical mechanical polishing (CMP). Excess metal is removed from the substrate surface exposing a portion of the ultra-low k dielectric layer during planarization. During CMP, the substrate is situated on a platen having an abrasive surface in a slurry environment. The CMP slurry is usually water based and includes chemicals that chemically polish the substrate surface. As the copper is removed, the exposed dielectric surface absorbs moisture from the slurry. Conventional drying and thermal baking may not sufficiently remove this moisture and in certain embodiments AEA baking is also used.

The substrate may be AEA baked in operation 27 to remove moisture after CMP. The AEA baking is used instead of or in addition to conventional thermal baking after CMP. The AEA baking is also used instead of or in addition to the AEA baking before metal filling in operation 21. At least one AEA bake is used to remove moisture in various methods of forming interconnects in various embodiments in accordance with the present invention. In some embodiments, a first AEA bake is used before metal filling and a second AEA baking is used after planarizing. The first and second AEA bakes need not have the same process conditions. For example, the first AEA bake may be for a longer duration or higher temperature than the second AEA bake. For example, the first AEA bake may last 10 minutes at 350° C. and the second AEA bake may last 2 minutes at 300° C.

Figure 3:
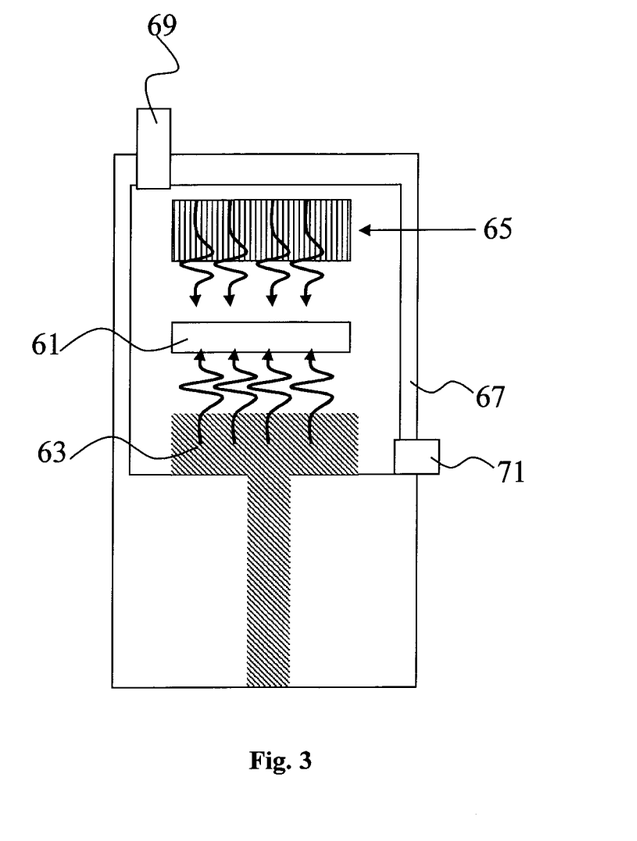
FIGS. 3 and 4 illustrate chamber embodiments suitable for practicing various method embodiments of the present invention.
Figure 4:
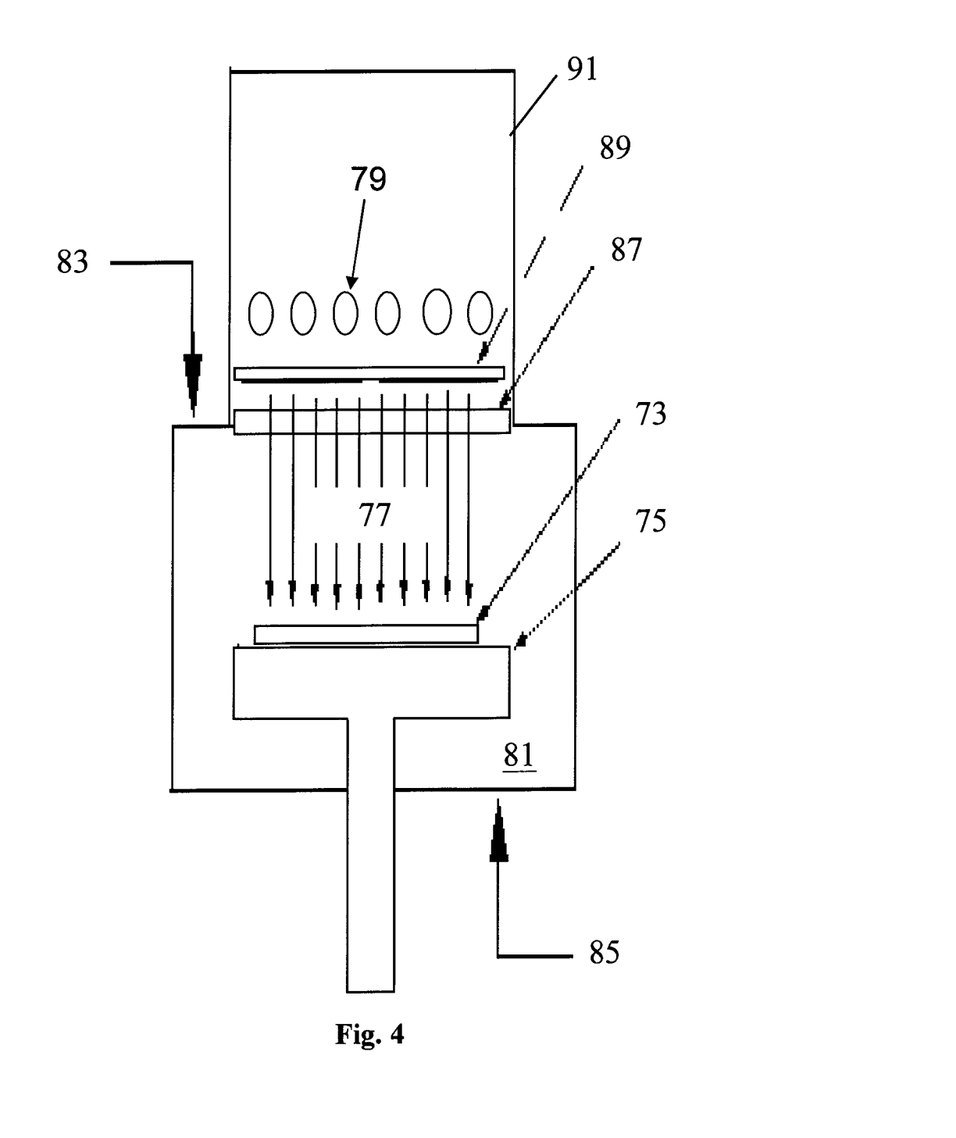

In another aspect, various embodiments of the present invention involve hardware for AEA baking. FIGS. 3 and 4 illustrate different embodiments of an AEA baking chamber. In FIG. 3, a substrate 61 is heated by heater pedestal 63 thermally and receives radiation from an AEA light source assembly 65 inside a sealed chamber 67. The chamber 67 may also include gas inlet 69 and pump outlet 71 for controlling the pressure and environment in the chamber 67 during AEA baking. For example, the AEA bake may occur at a pressure below one atmosphere in an inert environment such as nitrogen. In some cases, the AEA bake may occur in an environment including hydrogen or forming gas. In some embodiments, the chamber 67 includes regeneratable moisture getters to facilitate moisture removal.

In the embodiment of FIG. 3, the AEA light source assembly 65 includes one or more bulbs and light sources capable of irradiating the substrate with electromagnetic radiation having only wavelengths longer than about 400 nm. The AEA light source may include one or more light bulbs designed to not emit radiation having a wavelength shorter than about 400 nm. In AEA light source may be designed to irradiate the entire substrate or only a portion of the substrate. In some embodiments, the AEA light source may be one or more lasers that emit radiation having one or more wavelengths between about 400 nm and 1000 nm. For example, an argon-ion laser that emits radiation at 458 nm or a helium-neon laser at 633 nm may be used. To irradiate the entire substrate, one or more lasers may scan the surface of the substrate. Examples of various bulbs that may be used include high-intensity discharge (HID) bulbs and gas discharge bulbs. Further examples of HID bulbs include sodium vapor and metal halide bulbs.

The power of AEA light source is related to the duration of the exposure on the substrate. The AEA light source may be about 0.5 to 10 kilowatts, or at least 500 watts to limit the process time.

In the embodiment of FIG. 4, a substrate 73 is situated on a pedestal 75 inside a sealed chamber 81. The substrate receives radiation 77 from an AEA light source assembly 91 through a quartz window on an exterior of the chamber 81. The chamber 81 may also include gas inlet 83 and vacuum pump 85 for controlling the pressure and environment in the chamber 81 during AEA baking. In some embodiments, the chamber 81 also includes regeneratable moisture getters to facilitate moisture removal.

The AEA light source assembly as depicted also includes a filter 89. The light emitted by the light source 79 is filtered through the filter 89, which removes a portion of the light preventing the removed portion from reaching the substrate, so that as a whole, the light generated by the entire AEA light source assembly does not include wavelengths shorter than about 400 nm. One skilled in the art will note that the quartz window 87 may also be a filter. Known methods to form a quartz window with filter properties include doping the quartz with various additives during formation. The AEA light source assembly may also include other optical elements including reflectors and lenses. For example, a filter that excludes wavelengths longer than about 1000 nm may be used in some embodiments of the present invention.

Figure 5:
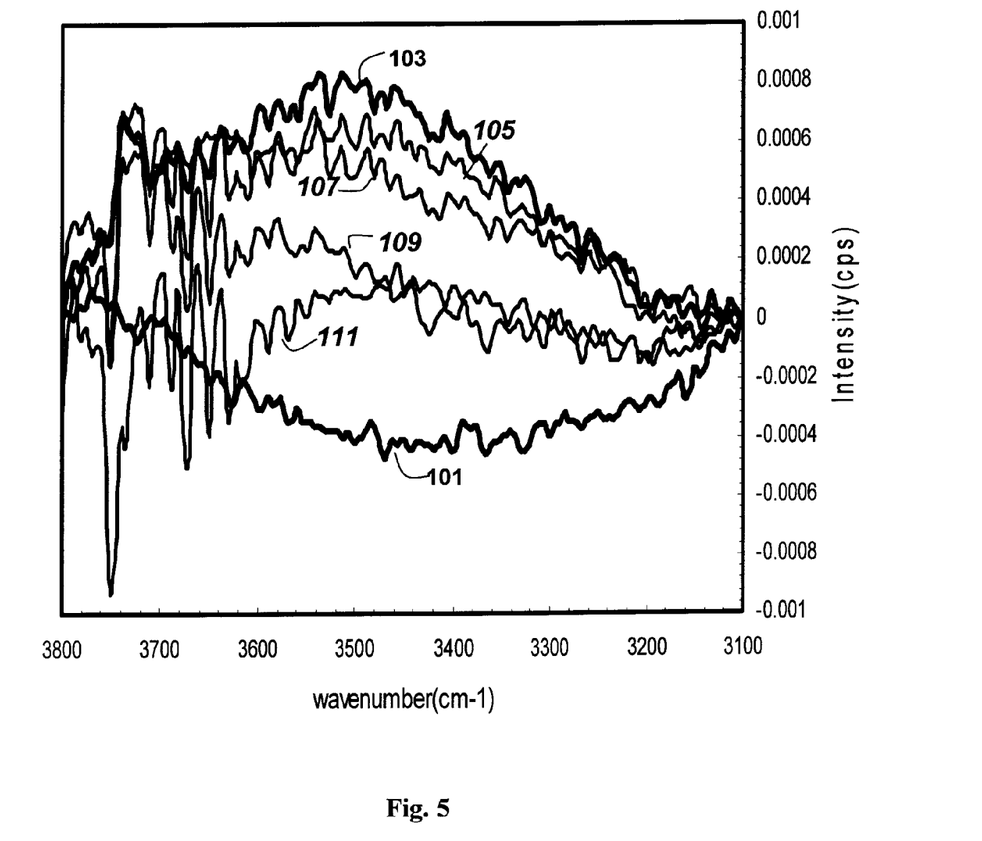
FIG. 5 is a graph of measurement data showing moisture content from substrates subjected to various baking regimes including embodiments of the present invention.

Experiments were conducted to compare a substrate after various baking treatments. FIG. 5 is Fourier transform spectroscopy IR (FTIR) data of various substrates. Line 101 is the result after deposition of the dielectric layer. Line 103 is the result from a substrate having the most moisture, after wet etching and before any baking. Thus, lines 101 and 103 are baselines for comparing efficiencies of various moisture removal bakes. Generally, the area below the curve presents the amount of moisture, with line 101 containing a minimum amount of moisture. It is believed that areas below the curve from wave numbers greater than about 3600 represent moisture in a dangling bond, such a Si—OH bond. Areas below the curve from wave numbers lower than about 3600 represent moisture in a weaker bond, such as a van der Waals bond.

The process conditions used to generate the data are summarized in the table below:

| Line # | Previous process | Baking condition | Baking Temp. in Celsius | Duration |
|---|---|---|---|---|
| 101 | Deposition | none | | |
| 103 | Wet etch | none | | |
| 105 | Wet etch | single wafer bake | 350 | 1 minute |
| 107 | Wet etch | batch furnace | 300 | 1.5 hours |

-continued

| Line # | Previous process | Baking condition | Baking Temp. in Celsius | Duration |
|---|---|---|---|---|
| 109 | Wet etch | AEA bake | 350 | 1 minute |
| 111 | Wet etch | UV light + bake | 350 | 1 minute |

Line 105, single wafer bake, represents the substrate with the most amount of moisture after baking. Line 107, batch furnace bake, is similar to line 105. Line 109 represents the process in accordance with some embodiments of the present invention. Lines 109 and 111 show comparable results at wave numbers lower than about 3500. At wave numbers greater than 3600, line 111, UV light assisted baking, shows lower intensity, suggesting less moisture overall than the substrate of line 109. However, as discussed above, exposure to UV light results in cross-linking in the ultra-low k film which changes the dielectric constant of the film and dimensions of the features. In many cases the cross-linking is not desirable. Thus, the AEA bake of line 109 results in moisture removal that is comparable to that of UV-assisted baking without cross-linking.

The foregoing has outlined features of several embodiments so that those skilled in the art may better understand the detailed description above. Those skilled in the art should appreciate that they may readily use the present disclosure as a basis for designing or modifying other processes and structures for carrying out the same purposes and/or achieving the same advantages of the embodiments introduced herein. For example, chamber hardware designs different from those discussed above may be suitable to generate a light having specified wavelengths for practicing the method embodiments of the present invention. It is understood, however, that these advantages are not meant to be limiting, and that other embodiments may offer other advantages. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming interconnects on a substrate, said method comprising:
    depositing an ultra-low k dielectric layer having a k value less than 2.5 on the substrate;
    etching a first pattern in the ultra-low k dielectric layer;
    active energy assist (AEA) baking by exposing the substrate to light having only wavelengths greater than 400 nm;
    filling the pattern with a metal; and,
    planarizing the metal to expose a portion of the ultra-low k dielectric layer.

2. The method of claim 1, further comprising AEA baking the substrate after planarizing.

3. The method of claim 1, wherein the active energy assist (AEA) baking the substrate is performed before filling the pattern with a metal.

4. The method of claim 1, further comprising etching a second pattern in the ultra-low k dielectric layer in an etching operation separate from the etching a first pattern.

5. The method of claim 1, further comprising preliminarily baking before AEA baking, said preliminarily baking comprising heating the substrate to about 350 degrees Celsius for 30 seconds to 2 minutes.

6. The method of claim 1, wherein the light intensity is from 10 to 500 W/cm$^2$.

7. The method of claim 1, wherein the light has only wavelengths between 400 nm and 1000 nm.

8. The method of claim 6, wherein the AEA baking further comprises thermally heating the substrate.

9. The method of claim 1, wherein the AEA baking of the substrate is performed for a duration of from about 1 to about 20 minutes.

10. The method of claim 1, wherein the substrate during the AEA baking has a temperature of from about 300 to about 400 degrees Celsius.

11. The method of claim 1, wherein the substrate during the AEA baking is heated to a temperature of about 350 degrees Celsius.

12. The method of claim 1, wherein the AEA baking of the substrate operation removes a portion of moisture absorbed in the ultra-low k dielectric layer.

13. The method of claim 1, wherein the planarizing is chemical mechanical polishing (CMP).

14. A method of forming interconnects on a substrate, said method comprising:
    depositing an ultra-low k dielectric layer having a k value less than 2.5 on the substrate;
    performing a first photo-lithography process to form a first pattern;
    etching the first pattern in the ultra-low k dielectric layer;
    performing a second photo-lithography process to form a second pattern;
    etching the second pattern in the ultra-low k dielectric layer;
    wet-cleaning the substrate;
    active energy assist (AEA) baking the substrate after the wet-cleaning by exposing the substrate to light having only wavelengths greater than 400 nm;
    filling the pattern with a metal; and,
    chemical mechanical polishing the metal to expose a portion of the ultra-low k dielectric layer.

15. The method of claim 14, further comprising AEA baking the substrate after the chemical mechanical polishing.

16. The method of claim 15, wherein the light intensity is from 10 to 500 W/cm$^2$.

17. The method of claim 15, wherein process conditions for the AEA baking after the wet-cleaning differ from process conditions for the AEA baking after the chemical mechanical polishing.

18. A method of forming interconnects on a substrate, said method comprising:
    depositing an ultra-low k dielectric layer having a k value less than 2.5 on the substrate;
    etching the first pattern in the ultra-low k dielectric layer;
    active energy assist (AEA) baking the substrate after the etching by exposing the substrate to light having only wavelengths greater than 400 nm; and
    filling the pattern with a metal.

19. The method of claim 18, wherein the AEA baking further comprises controlling an environment inside the AEA chamber using a gas inlet and a vacuum pump.

20. The method of claim 18, wherein the AEA baking further comprises filtering the light emitted by the light source to expose the substrate to light having a wavelength in a range from 400 nm to 1000 nm.

* * * * *